United States Patent
Eisele

(10) Patent No.: US 10,685,894 B2
(45) Date of Patent: Jun. 16, 2020

(54) SEMI-CONDUCTOR MODULE WITH AN ENCAPSULATING CEMENT MASS THAT COVERS A SEMI-CONDUCTOR COMPONENT

(71) Applicant: Heraeus Deutschland GmbH & Co. KG, Hanau (DE)

(72) Inventor: Ronald Eisele, Surendorf (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 0 days.

(21) Appl. No.: 15/034,626

(22) PCT Filed: Oct. 14, 2014

(86) PCT No.: PCT/EP2014/072012
§ 371 (c)(1),
(2) Date: May 5, 2016

(87) PCT Pub. No.: WO2015/067441
PCT Pub. Date: May 14, 2015

(65) Prior Publication Data
US 2016/0260648 A1    Sep. 8, 2016

(30) Foreign Application Priority Data
Nov. 7, 2013   (DE) .................. 10 2013 112 267

(51) Int. Cl.
*H01L 23/29*    (2006.01)
*H01L 23/31*    (2006.01)
(Continued)

(52) U.S. Cl.
CPC ............ *H01L 23/291* (2013.01); *H01L 23/29* (2013.01); *H01L 23/3135* (2013.01);
(Continued)

(58) Field of Classification Search
CPC ............................. H01L 23/29; H01L 23/291
See application file for complete search history.

(56) References Cited

U.S. PATENT DOCUMENTS 5,300,459 A * 4/1994 Ushikubo ............. H01L 23/291
257/E23.032
7,034,660 B2   4/2006 Watters et al.
(Continued)

FOREIGN PATENT DOCUMENTS

CN        101933105 A    12/2010
DE    102008007021 A1     8/2009
(Continued)

OTHER PUBLICATIONS

Int'l Search Report dated May 14, 2015 in Int'l Application No. PCT/EP2014/072012.
(Continued)

*Primary Examiner* — Zandra V Smith
*Assistant Examiner* — Abbigale A Boyle
(74) *Attorney, Agent, or Firm* — Panitch Schwarze Belisario & Nadel LLP

(57) ABSTRACT

A semi-conductor module with an encapsulating mass that covers a semi-conductor component, in which the encapsulating mass is cement.

15 Claims, 3 Drawing Sheets

(51) Int. Cl.
  *H01L 23/433* (2006.01)
  *H01L 23/373* (2006.01)
  *H01L 23/367* (2006.01)
  *H01L 23/00* (2006.01)
  *H01L 23/473* (2006.01)

(52) U.S. Cl.
  CPC ...... *H01L 23/3185* (2013.01); *H01L 23/3675* (2013.01); *H01L 23/3735* (2013.01); *H01L 23/4334* (2013.01); *H01L 24/46* (2013.01); *H01L 23/3121* (2013.01); *H01L 23/3672* (2013.01); *H01L 23/473* (2013.01); *H01L 24/32* (2013.01); *H01L 24/48* (2013.01); *H01L 24/73* (2013.01); *H01L 2224/04042* (2013.01); *H01L 2224/04105* (2013.01); *H01L 2224/32225* (2013.01); *H01L 2224/48091* (2013.01); *H01L 2224/48105* (2013.01); *H01L 2224/48227* (2013.01); *H01L 2224/48472* (2013.01); *H01L 2224/73265* (2013.01); *H01L 2924/00014* (2013.01); *H01L 2924/181* (2013.01); *H01L 2924/19107* (2013.01)

(56) References Cited

U.S. PATENT DOCUMENTS

| | | | |
|---|---|---|---|
| 8,637,980 B1* | 1/2014 | Lower | H01L 21/50 257/678 |
| 2009/0047797 A1 | 2/2009 | Anderson et al. | |
| 2009/0068474 A1 | 3/2009 | Lower et al. | |
| 2010/0090335 A1 | 4/2010 | Chung | |
| 2010/0328007 A1* | 12/2010 | Witzani | H01F 3/14 336/178 |
| 2011/0124483 A1 | 5/2011 | Shah et al. | |
| 2013/0229777 A1 | 9/2013 | Otremba et al. | |
| 2014/0001613 A1* | 1/2014 | Ha | H01L 23/24 257/675 |

FOREIGN PATENT DOCUMENTS

| | | |
|---|---|---|
| EP | 0827215 A2 | 3/1998 |
| GB | 1095387 A | 12/1967 |
| JP | S 60226149 A | 11/1985 |
| JP | 2000340718 A | 12/2000 |
| JP | 2004286491 A | 10/2004 |
| JP | 2010245566 A | 10/2010 |
| JP | 2013225556 A | 10/2013 |
| WO | 2005123624 A2 | 12/2005 |

OTHER PUBLICATIONS

English Translation of Office Action and Search Report dated Feb. 26, 2018 in TW Application No. 103137949.
Office Action dated Dec. 12, 2017 in JP Application No. 2016-550968.
Office Action dated Oct. 30, 2017 in KR Application No. 10-2016-7014401.
"Glassbond Sauereisen Zircon Potting Cement No. 13R" Data Sheet, 2 pgs.(2007).
Office Action dated Nov. 13, 2017 in CN Application No. 201480061050.9 (Partial Translation).
Office Action dated Sep. 9, 2019 in CN Application 201480061050.9 (Brief English Summary).

* cited by examiner

SEMI-CONDUCTOR MODULE WITH AN ENCAPSULATING CEMENT MASS THAT COVERS A SEMI-CONDUCTOR COMPONENT

CROSS-REFERENCE TO RELATED APPLICATIONS

This application is a Section 371 of International Application No. PCT/EP2014/072012, filed Oct. 14, 2014, which was published in the German language on May 14, 2015 under International Publication No. WO 2015/067441 A1, and the disclosure of which is incorporated herein by reference.

BACKGROUND OF THE INVENTION

The invention relates to a semi-conductor module with an encapsulating mass that covers a semi-conductor.

U.S. Pat. No. 7,034,660 B2 discloses a wireless sensor that is embedded in concrete or any other cement-containing material in order to detect parameters that are indicative of changes in construction materials. The sensor can be, for example, an electrochemical sensor that is well-suited for detecting chloride ions.

Preferably, the encapsulation of individual semi-conductors and semi-conductor sub-assemblies (including passive components) on substrates is effected nowadays with organic masses based on epoxy resin, with, in some cases, organic filling materials, such as silicon dioxide ($SiO_2$). U.S. Pat. No. 4,529,755, for example, discloses an encapsulating mass of this type comprising a poly-functional epoxy compound, a styrene-type block copolymer, a hardener for the epoxy compound, and an inorganic filler.

These encapsulated components and sub-assemblies typically have electrical connectors and cooling connection surfaces for the integrated power components. Hardened epoxy resins (non-reinforced) have typical thermal expansion coefficients (CTE, coefficient of thermal expansion) of approx. 60-80 ppm/K. Substrates (ceramic, metal, and organic core circuit boards) possess clearly lower thermal expansion coefficients (3-20 ppm/K). For applications of power electronics, the focus is on components and sub-assemblies with high power dissipation and, to some extent, high operating voltages as well, i.e., insulation requirements. It is customary in power electronic components and sub-assemblies to mainly use ceramic substrates with cores made of $Al_2O_3$, AlN or $Si_3N_4$ having CTEs of 3-8 ppm/K.

In this context, these sub-assemblies are further encapsulated by organic masses, which have to compensate for the mal-adaptation to the ceramic substrate due to elastic expansion and deformation of the module. However, this mal-adaptation between ceramic substrate and encapsulating mass and the ensuing mechanical shear stress lead to delamination and destruction of the inner contacting, e.g., bond wires.

Enriching the organic matrix material with fillers showing low expansion leads to low viscosities and critical behavior during processing. The masses become liquefied at high temperatures and are pressed into the cavities of the tool shells at high pressure in order to ensure that the filling is free of shrink holes. However, this process is error-prone proportional to the increasing degree of filling (shrink hole) and very energy-consuming due to the high temperatures (160° C.-200° C.) and pressures (15-25 MPa).

Finally, the need to have an organic matrix leads to the thermal conductivity being very low and usually being only insignificantly higher than the thermal conductivity of epoxy resins (approx. 0.4 W/mK), despite the admixture of filler contents.

BRIEF SUMMARY OF THE INVENTION

It is therefore the object of the present invention to create a semi-conductor module, in particular a power electronics sub-assembly, that is resistant to thermal stress.

This object is met by a semi-conductor module comprising an encapsulating mass covering a semi-conductor component, wherein the encapsulating mass is cement.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
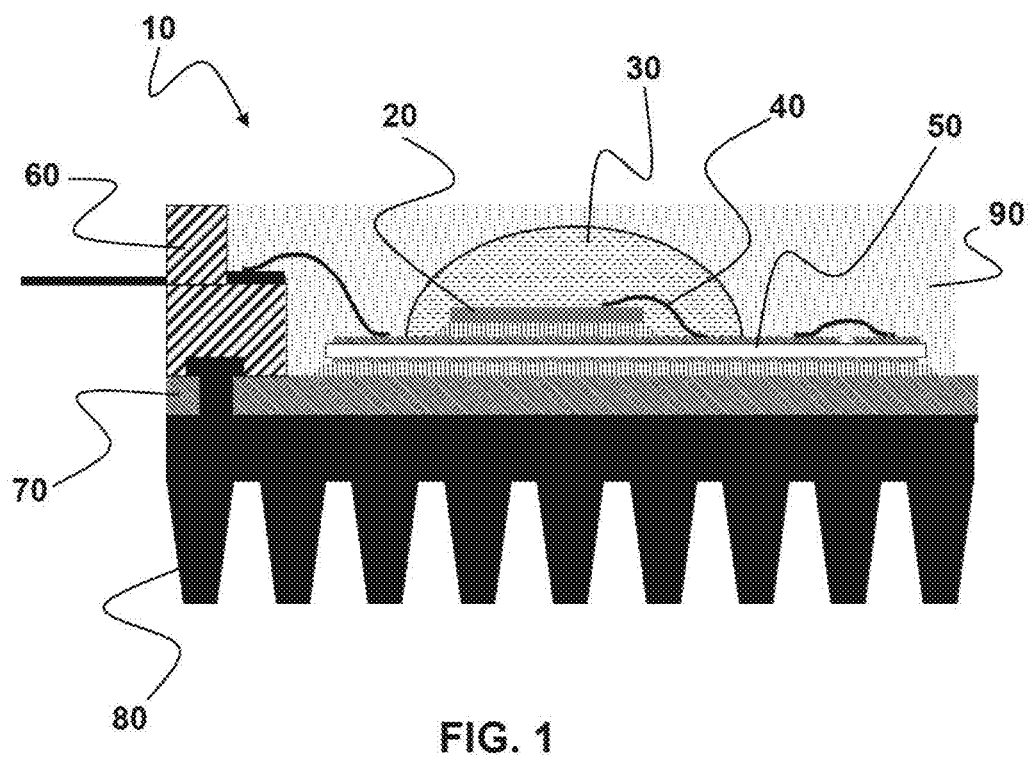
FIG. 1 is a schematic of a semi-conductor module according to a first exemplary embodiment of the invention, in which the encapsulating mass is provided as glob-top.

The underlying rationale of the invention is to use cement as a purely inorganic, metal-free material for encapsulating semi-conductor components. The focus in this context is on an adapted thermal expansion between a semi-conductor (CTE typically 2.5-4 ppm/K) and the encapsulating material to arise.

Cements are oxidic materials and, as inorganic and non-metallic building materials, possess combinations of properties that are advantageous for encapsulating semi-conductors, namely high electrical insulation (20-100 kV/mm), relatively good thermal conductivity (1-2 W/mK), and low thermal expansion (2-10 ppm/K). Cements are usually made from natural raw materials, limestone, clay, and marl, and can comprise quartz sand and iron oxide-containing substances to improve sintering. A cement that is particularly preferably used for the present invention can, for example, be produced advantageously from the basic raw materials magnesium oxide, zirconium silicate, and magnesium phosphate.

In order to increase the thermal conductivity, the inorganic encapsulating mass of the power component preferably comprises aluminum nitride and/or boron nitride as aggregate. Aluminum oxide and/or silicon nitride as aggregates also have a beneficial effect on the thermal conductivity (in combination with the substances specified above, if applicable).

Preferably, the encapsulating mass is a heat bridge that establishes the thermal pathway to a metallic cooling element made of aluminum (Al) or copper (Cu) which leaves the boundary surface of the encapsulated component or is arranged in the plane of the surface without being covered. It is particularly preferable for the mass to adhere by a chemical bond (i.e., a physical connection with particularly good heat conductivity). Accordingly, heat can be dissipated on multiple sides by combining substrate-based cooling and encapsulating mass-based cooling.

The uncoated component on the substrate and/or the uncoated sub-assembly can preferably comprise an adhesion-promoting layer (primer), in particular made of a polyacrylate dispersion. This dispersion is applied onto the sub-assembly as a thin layer (e.g., by spraying) and covers the components to be encapsulated and the component-side surface of the substrate to the extent to which it is covered by the encapsulating mass.

Since cement typically possesses residual porosity after it sets, a moisture-resistant coating may be provided. Two strategies are feasible for this purpose: filling the capillaries with low viscosity protective masses which set to permanently seal the capillaries (in particular, aqueous solutions of potassium or lithium silicates are well-suited for this purpose), or coating the cement surface with a protective layer through which moisture penetrates not at all or only slightly. In particular, set epoxy resin layers (varnishes) are well-suited for this purpose.

Although the differences in expansion between semi-conductor components, substrate, and encapsulation are minimized according to the invention through the selection of inorganic cement, these differences are not eliminated altogether. Accordingly, temperature gradients within the encapsulated volume lead to mechanical tension which, in turn, leads to shear tension within the cement, in particular at the boundaries to semi-conductors and to the substrate. Cements are relatively resistant to compressive stress, but sensitive to tensile stress.

It is therefore preferable to integrate fibers into the raw cement mass as an aggregate that distributes the tensile stress to a larger volume and thus increases the tensile stress resistance. Taken together, this leads to higher resistance to cyclic temperature stress. Much like the cement, suitable fibers need to be electrically non-conductive and capable of producing a physical bond to the cement. It is customary to use inorganic fibers for this purpose, such as, for example, glass fibers, basalt fibers, boron fibers, and ceramic fibers, for example, silicon carbide fibers and aluminum oxide fibers. High-melting organic fibers can be used as well, such as, for example, aramid fibers.

The capability of the cement to bond physically enables preferred heat conduction from the semi-conductor, which is subject to power dissipation, via the cement mass to the cooling element. This can be either one-sided or (originating from the semi-conductor) multi-sided.

FIG. 1 is a schematic of a semi-conductor module according to the invention according to a first exemplary embodiment, in which the encapsulating mass is provided as "glob-top."

FIG. 1 shows a semi-conductor module 10, preferably designed as a sub-assembly for power electronics, with a semi-conductor component 20 that is covered by an encapsulating mass, which, according to the invention, consists of cement. Preferably, the bond wires contacting the semi-conductor component 20 are also covered and/or encapsulated by the encapsulating mass, at least in part, but particularly preferably completely.

In this context, the semi-conductor component in a known manner is attached on a ceramic substrate 50 which, in turn, is applied to the upper side of a heat dissipation plate 70 whose underside is connected to a cooling element 80. Moreover, the semi-conductor module 10 comprises a frame 60 to support electrical contacts that are routed towards the outside.

In this first exemplary embodiment, the encapsulating mass 30 consisting of cement is provided simply as a droplet ("glob-top") that covers/encapsulates the semi-conductor component 20 and its bond wires 40. In this context, the "glob-top" and the other surface regions of the semi-conductor module 10 are covered by an insulating mass 90, for example a silicone gel.

Figure 2:
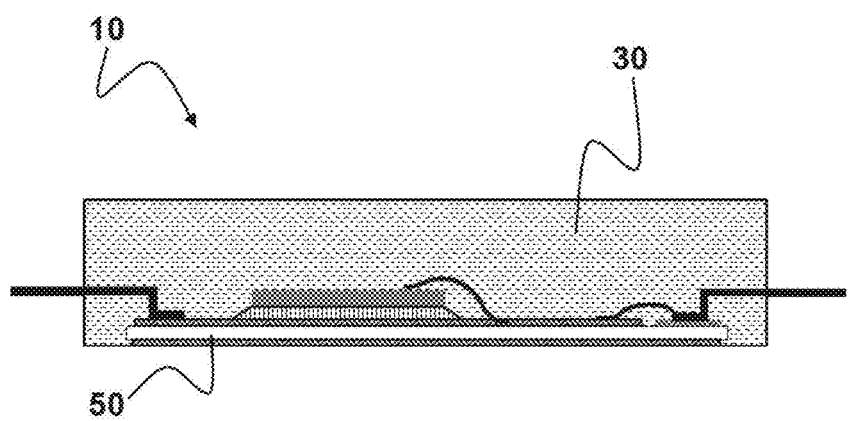
FIG. 2 is a schematic of a semi-conductor module according to a second exemplary embodiment, which, except for the mechanical-electrical contact leads, is fully encapsulated by the encapsulation mass.

FIG. 2 shows a semi-conductor module 10 designed according to a second exemplary embodiment to have a frameless design, which, except for the electrical and thermal contact surfaces, is fully encapsulated by the encapsulating mass consisting of cement.

Figure 3:
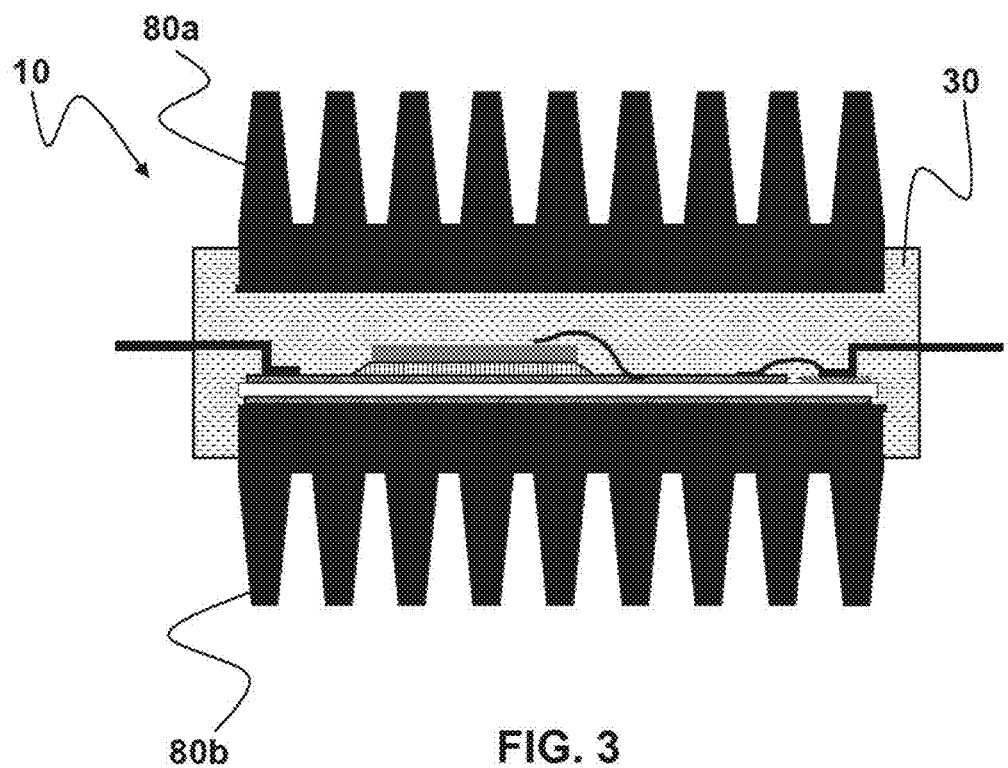
FIG. 3 is a schematic of a semi-conductor module according to a third exemplary embodiment with cooling elements for air cooling arranged on both sides of the semi-conductor.

This refinement is well-suited, in particular, as a starting point for the exemplary embodiments shown in the following figures:

FIG. 3 shows a power sub-assembly with air cooling provided on two sides, whereby the upper cooling element 80a is physically connected to a heat bridge consisting of the inorganic encapsulating mass of cement physically contacting the cooling element, and the lower cooling element 80b is physically connected to the substrate.

The cooler structure shown is a single part and is connected to cooling ribs or cooling pins such that air or water can pass through as a turbulent process.

Figure 4:
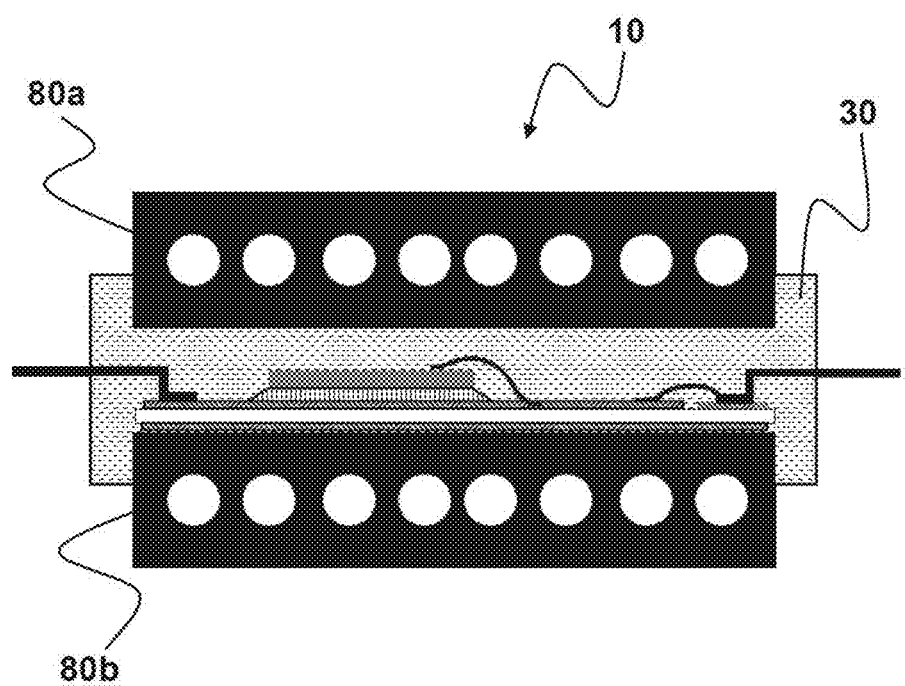
FIG. 4 is a schematic of a semi-conductor module according to a fourth exemplary embodiment with cooling elements for water cooling arranged on both sides of the semi-conductor.

FIG. 4 shows a power sub-assembly with two-sided water cooling according to the refinement shown in FIG. 3, whereby the cooler structure shown in FIG. 4 is provided in a single part and is provided with internal water-conducting channels such that water can pass through in a closed structure with short sealing length.

Figure 5:
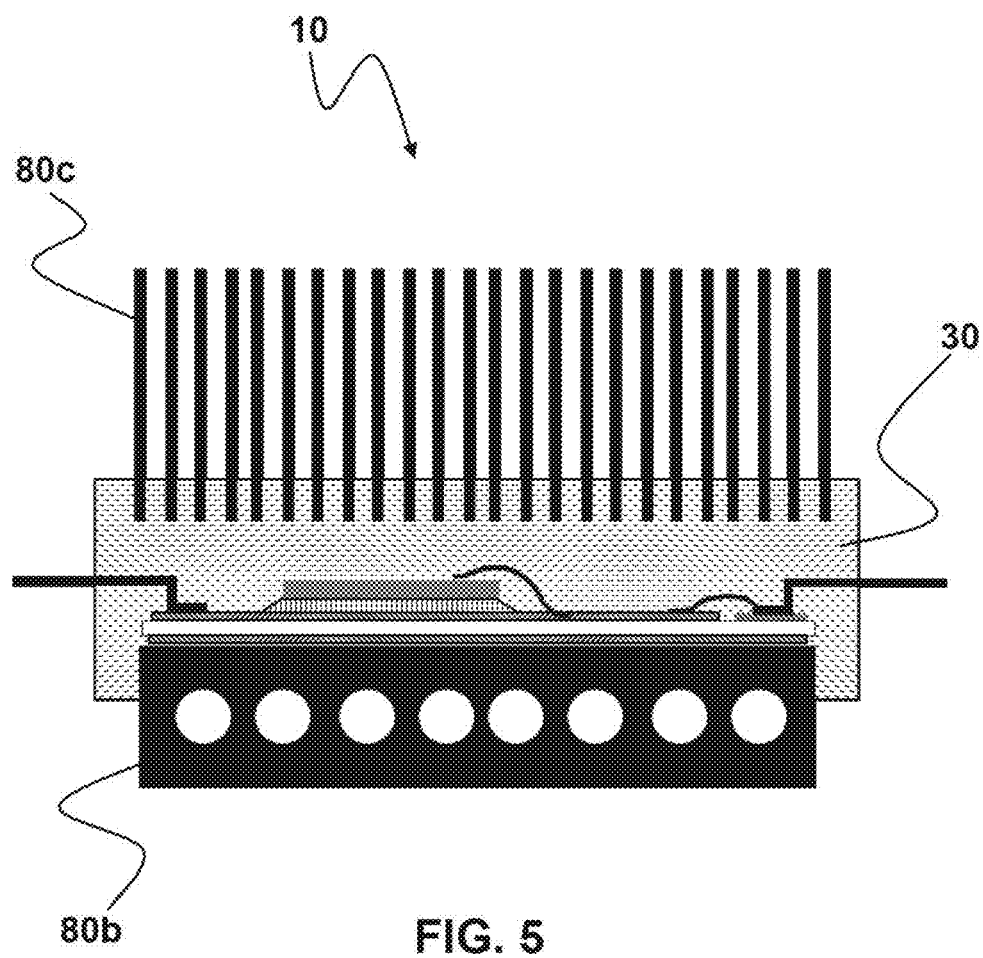
FIG. 5 is a schematic of a semi-conductor module according to a fifth exemplary embodiment with a cooling element for air cooling arranged on one side of the semi-conductor and a cooling element for water cooling arranged on the other side of the semi-conductor.

Lastly, FIG. 5 shows a power sub-assembly with two-sided cooling, whereby the lower cooling element 80b is again provided as a single part, whereas the upper cooling element 80c is provided as multiple parts. The cooler structure shown as upper cooling element 80c consists of, for example, a plurality of cooling plates extending over the upper side of the semi-conductor module 10 or consists of a plurality of cooling pins distributed over the surface of the semi-conductor module 10.

The advantage of the use of cement as an encapsulating mass and/or matrix for encapsulating semi-conductor components or semi-conductor sub-assemblies, in particular power electronics sub-assemblies, as according to the invention, is a good heat conductivity of 1.2 to 1.6 W/mK and low thermal expansion (CTE) of approx. 4.7 ppm/K. Moreover, cement is free of halogens and compatible with metal. Since the encapsulation of the semi-conductor component and/or of the semi-conductor sub-assembly can proceed under atmospheric conditions and in temperature ranges that correspond to the operating temperature of the semi-conductor module, the semi-conductor module cannot become distorted. Finally, cement also adheres well to circuit board surfaces (Cu, Ni/Au).

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

I claim:

1. A semi-conductor module comprising a semi-conductor component, a substrate, an encapsulating mass, a protective layer on the encapsulating mass, an insulating mass, and bond wires, wherein the encapsulating mass is an electrically insulating cement produced from magnesium oxide, zirconium silicate, and magnesium phosphate raw materials, the encapsulating mass is in a form of a "glob-top" or droplet which encapsulates at least the semi-conductor component and at least partly encapsulates the bond wires, wherein a plurality of surfaces of the substrate that provide electrical and thermal contact are not encapsulated, wherein the insulating mass fully encapsulates the semi-conductor component, the substrate, and the encapsulating mass, wherein the protective layer comprises a moisture-resistant coating comprising a set epoxy resin, and wherein the bond wires are connected to the semi-conductor component.

2. The semi-conductor module according to claim 1, wherein the cement comprises an aggregate aluminum nitride, boron nitride, aluminum oxide and/or silicon nitride.

3. The semi-conductor module according to claim 1, wherein the cement comprises a fibrous component dispersed therein.

4. The semi-conductor module according to claim 1, further comprising at least one cooling element physically connected to the cement.

5. The semi-conductor module according to claim 4, wherein the cooling element is an air-cooled or a liquid-cooled cooling element.

6. The semi-conductor module according to claim 1, wherein the semi-conductor module is a power electronics sub-assembly.

7. The semi-conductor module according to claim 1, wherein the insulating mass is a silicone gel.

8. A semi-conductor module having no frame and comprising a semi-conductor component, a substrate, bond wires, an encapsulating mass, and a protective layer on the encapsulating mass, wherein the encapsulating mass is an electrically insulating cement produced from magnesium oxide, zirconium silicate, and magnesium phosphate raw materials, wherein the bond wires are connected to the semi-conductor component, and wherein the encapsulating mass fully encapsulates the semi-conductor component and the substrate and at least partly encapsulates the bond wires, wherein a plurality of surfaces of the substrate that provide electrical and thermal contact are not encapsulated, and wherein the protective layer comprises a moisture-resistant coating comprising a set epoxy resin.

9. The semi-conductor module according to claim 8, wherein the cement comprises an aggregate aluminum nitride, boron nitride, aluminum oxide and/or silicon nitride.

10. The semi-conductor module according to claim 8, wherein the cement comprises a fibrous component dispersed therein.

11. The semi-conductor module according to claim 8, further comprising at least one cooling element physically connected to the cement.

12. The semi-conductor module according to claim 11, wherein the cooling element is an air-cooled or a liquid-cooled cooling element.

13. The semi-conductor module according to claim 8, wherein the semi-conductor module is a power electronics sub-assembly.

14. The semi-conductor module according to claim 1, wherein the substrate comprises a ceramic.

15. The semi-conductor module according to claim 8, wherein the substrate comprises a ceramic.

* * * * *